(12) United States Patent
Lee

(10) Patent No.: US 10,461,708 B2
(45) Date of Patent: Oct. 29, 2019

(54) SIGNAL AMPLIFIER, SIGNAL RECEIVING CIRCUIT INCLUDING THE SAME, AND DEVICE INCLUDING THE SAME

(71) Applicant: SAMSUNG ELECTRONICS CO., LTD., Suwon-si, Gyeonggi-do (KR)

(72) Inventor: Soo Min Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/975,234

(22) Filed: May 9, 2018

(65) Prior Publication Data

US 2019/0068145 A1  Feb. 28, 2019

(30) Foreign Application Priority Data

Aug. 24, 2017 (KR) .................. 10-2017-0107102

(51) Int. Cl.
*H03F 3/45* (2006.01)
*G11C 7/10* (2006.01)

(52) U.S. Cl.
CPC ..... *H03F 3/45192* (2013.01); *H03F 3/45479* (2013.01); *G11C 7/1051* (2013.01); *H03F 2203/45301* (2013.01)

(58) Field of Classification Search
CPC ........................................................ H03F 3/45
See application file for complete search history.

(56) References Cited

U.S. PATENT DOCUMENTS

| 5,574,401 | A | 11/1996 | Spitalny |
| 6,236,270 | B1 | 5/2001 | Takeuchi |
| 6,366,167 | B1 | 4/2002 | Stockstad |
| 7,142,056 | B2 | 11/2006 | Blecker et al. |
| 7,696,817 | B1* | 4/2010 | Boucher ............. H03F 3/45475 330/51 |
| 8,773,174 | B2 | 7/2014 | Want et al. |
| 8,912,818 | B2 | 12/2014 | Bhakta et al. |
| 9,178,503 | B2 | 11/2015 | Hsieh |
| 9,356,570 | B2 | 5/2016 | Rombach |
| 9,473,122 | B1 | 10/2016 | Shen et al. |
| 2014/0139017 | A1 | 5/2014 | Alex |

* cited by examiner

*Primary Examiner* — Patricia T Nguyen
(74) *Attorney, Agent, or Firm* — Lee & Morse, P.C.

(57) ABSTRACT

A signal amplifier includes a first amplifier, a second amplifier, and an output. The first amplifier amplifies a first input signal to form a first amplified output signal. The first input signal has a common mode voltage in a first voltage range, and the first amplified output signal has a common mode voltage in a second voltage range different from the first voltage range. The second amplifier amplifies a second input signal to form a second amplified output signal. The first input signal has the common mode voltage in the second voltage range and the second amplified output signal has the common mode voltage in the second voltage range. The output outputs the first amplified output signal or the second amplified output signal as an amplified output signal.

20 Claims, 9 Drawing Sheets

SIGNAL AMPLIFIER, SIGNAL RECEIVING CIRCUIT INCLUDING THE SAME, AND DEVICE INCLUDING THE SAME

CROSS-REFERENCE TO RELATED APPLICATION

Korean Patent Application No. 10-2017-0107102, filed on Aug. 24, 2017, and entitled, "Signal Amplifier, Signal Receiving Circuit Including the Same, and Device Including the Same," is incorporated by reference herein in its entirety.

BACKGROUND

1. Field

One or more embodiments described herein relate to a signal amplifier, a signal receiving including a signal amplifier, and a device including a signal amplifier.

2. Description of the Related Art

An interface circuit transmits and receives data and/or other signals between devices. The magnitude of signals (e.g., voltage range) output from a transmitter of the interface circuit may vary depending on the type of transmitter, the device including the transmitter, and/or other factors. The range of input signals that can be received by a signal receiver of the interface circuit may limit the variety of devices with which the interface circuit can operate.

SUMMARY

In accordance with one or more embodiments, a signal amplifier includes a first amplifier to amplify a first input signal to form a first amplified output signal, the first input signal having a common mode voltage in a first voltage range and the first amplified output signal having a common mode voltage in a second voltage range different from the first voltage range; a second amplifier to amplify a second input signal to form a second amplified output signal, the first input signal having the common mode voltage in the second voltage range and the second amplified output signal having the common mode voltage in the second voltage range; and an output to output the first or second amplified output signal as an amplified output signal.

In accordance with one or more other embodiments, a signal receiving circuit includes a switching circuit to output a reception signal as a first input signal when a common mode voltage of the reception signal is in a first voltage range and to output the reception signal as a second input signal when the common mode voltage of the reception signal is in a second voltage range, different from the first voltage range, based on an enable signal; and a signal amplifier to amplify the first input signal or the second input signal to output an amplified output signal having the common mode voltage in the second voltage range based on the enable signal.

In accordance with one or more other embodiments, a device includes a signal receiver including: switching portion to output a reception signal to form a first input signal when a common mode voltage of the reception signal is in a first voltage range and output the reception signal to form a second input signal when the common mode voltage of the reception signal is in a second voltage range, different from the first voltage range, based on an enable signal, a signal amplifier to amplify the first input signal or the second input signal to form an amplified output signal having the common mode voltage in the second voltage range based on the enable signal, and an output to receive the amplified output signal and to output an output signal; a signal transmitter to receive a transmission signal and to output a transmitted output signal; and a controller to receive the output signal and output the transmission signal.

In accordance with one or more other embodiments, a signal amplifier includes a first type folded-cascode amplifying part configured to receive a first input signal pair and output a first amplified output signal pair in response to first state of an enable signal, a second type common source amplifying part configured to receive a second input signal pair and output a second amplified output signal pair in response to second stage of the enable signal, and an output part comprising a load for the first type folded-cascode amplifying part and the second type common source amplifying part, and configured to output one of the first amplified output signal pair and the second amplified output signal pair as an amplified output signal pair.

In accordance with one or more other embodiments, a signal receiving circuit includes a signal amplifying portion comprising a first type folded-cascode amplifier configured to receive a first input signal pair and output a first amplified output signal pair in response to first state of an enable signal, a second type common source amplifier configured to receive a second input signal pair and output a second amplified output signal pair in response to second stage of the enable signal, and an output comprising a load for the first type folded-cascode amplifying part and the second type common source amplifying part, and configured to output one of the first amplified output signal pair and the second amplified output signal pair as an amplified output signal pair, and an output portion configured to output an output signal based on the amplified output signal pair, wherein an input terminal of the output portion comprises transistors of a same conductivity type.

BRIEF DESCRIPTION OF DRAWINGS

Features will become apparent to those of skill in the art by describing in detail exemplary embodiments with reference to the attached drawings in which.

DETAILED DESCRIPTION

Figure 1:
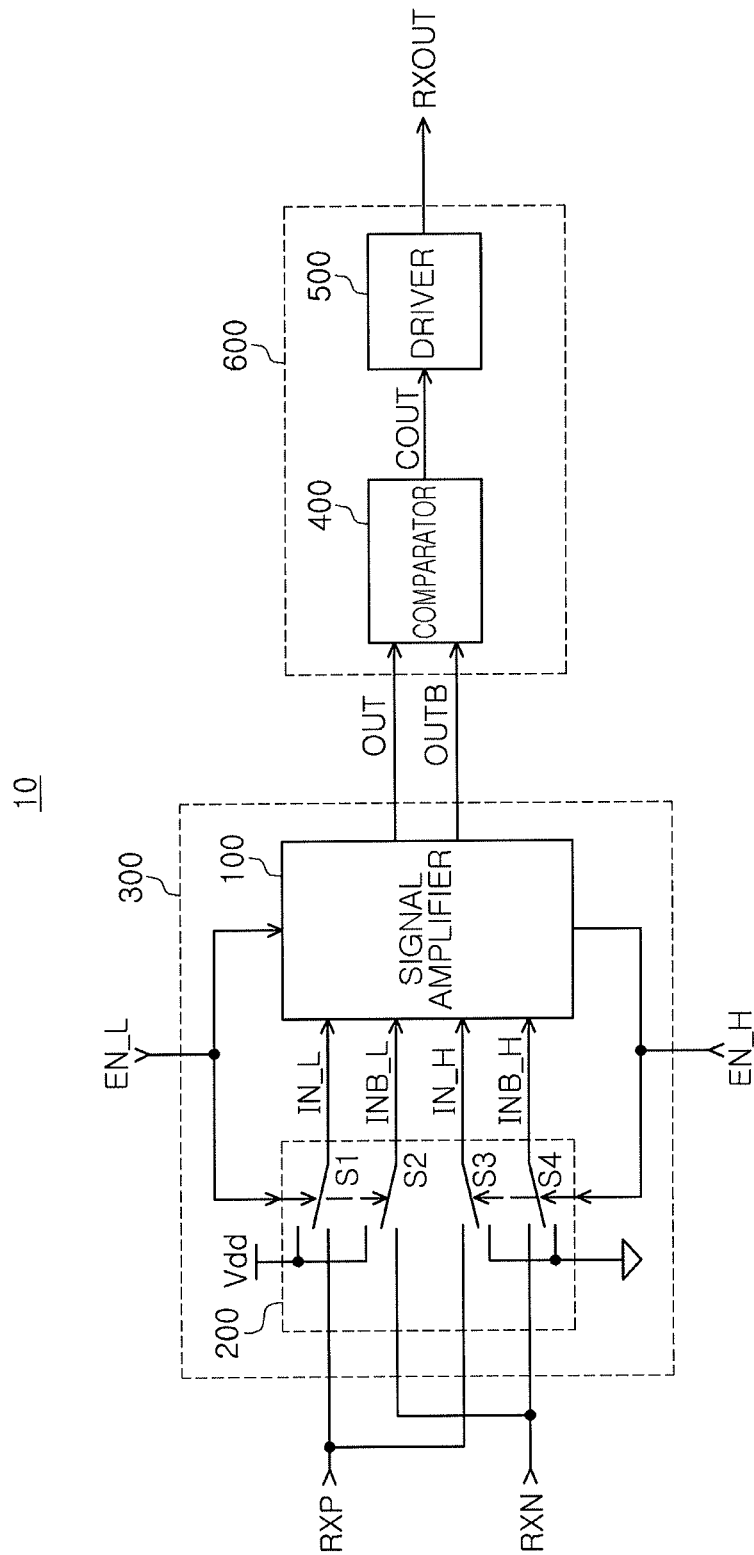
FIG. 1 illustrates an embodiment of a signal receiving circuit.

FIG. 1 illustrates an embodiment of a signal receiving circuit which may include an amplification portion 300 and an output portion 600. The amplification portion 300 may include a signal amplifier 100 and a switching portion 200. The output portion 600 may include a comparator 400 and a driver 500.

The amplification portion 300 may receive reception signals RXP and RXN to be amplified and may output amplified output signals OUT and OUTB. A common mode voltage of the reception signals RXP and RXN may have a value closer to a source voltage than to a ground voltage or may have a value closer to the ground voltage than to the source voltage. In some embodiments, the common mode voltage may correspond to a median value of a voltage range of signals. For example, the common mode voltage may be provided as one value of the voltage range of signals and may be provided as a representative signal value. The common mode voltage of the amplified output signals OUT and OUTB may have predetermined values set regardless of the common mode voltage of the reception signals RXP and RXN.

The signal amplifier 100 of the amplification portion 300 may be operated based on enable signals EN_L and EN_H. The signal amplifier 100 may receive the input signals IN_L, INB_L, IN_H, and INB_L and may amplify a portion of the input signals IN_L, INB_L, IN_H, and INB_L to output the amplified output signals OUT and OUTB. For example, one portion of the signal amplifier 100 (e.g., a component of the signal amplifier 100) may be activated based on the enable signals EN_L and EN_H, while another portion thereof may be deactivated. The enable signals EN_L and EN_H may be determined according to the common mode voltage of the reception signals RXP and RXN (or a voltage range of the reception signals RXP and RXN). The amount of power consumed may be reduced through operations described above.

A bias voltage applied to a bias circuit in the signal amplifier 100 may be generated based on an output signal of an amplifier in the signal amplifier 100. Since a separate bias voltage generating portion for generating the bias voltage is unnecessary, sizes of the signal amplifier 100 and the signal receiving circuit 10 may be reduced. In addition, the signal amplifier 100 may include a negative feedback circuit (e.g., through a configuration described above) to stabilize the amplified output signals OUT and OUTB.

A range of input signals IN_L and INB_L (or a magnitude of a common mode voltage of the input signals IN_L and INB_L) may be different from a range of input signals IN_H and INB_H (or a magnitude of a common mode voltage of the input signals IN_H and INB_H). For example, the common mode voltage of the input signals IN_L and INB_L may be close to (e.g., within a predetermined tolerance or range) the ground voltage, while the common mode voltage of the input signals IN_H and INB_H may be close to (e.g., within a predetermined tolerance or range) the source voltage.

A range of amplified output signals OUT and OUTB or the common mode voltage of the amplified output signals OUT and OUTB may have a predetermined value regardless of the input signals IN_L, INB_L, IN_H, and INB_H. The common mode voltage of the amplified output signals OUT and OUTB may have a value closer to the ground voltage or to the source voltage.

Each of the input signals IN_L and INB_L, the input signals IN_H and INB_H, and the amplified output signals OUT and OUTB may be provided as complementary signals. In one embodiment, one of the input signals IN_L and INB_L, the input signals IN_H and INB_H, and the amplified output signals OUT and OUTB may, respectively, be provided as a reference signal in which a level of a signal is fixed, and the other may be provided as a signal in which the level of a signal is variable.

The switching portion 200 may include a plurality of switches S1, S2, S3, and S4. The switching portion 200 may output the reception signals RXP and RXN to be the input signals IN_L and INB_L or the input signals IN_H and INB_H, based on the enable signals EN_L and EN_H.

The enable signals EN_L and EN_H may be determined according to the common mode voltage of the reception signals RXP and RXN (or a voltage range of the reception signals RXP and RXN). For example, an enable signal EN_L having a high level may be provided when the common mode voltage of the reception signals RXP and RXN is closer to the ground voltage than to the source voltage. The enable signal EN_L having a low level may be provided when the common mode voltage of the reception signals RXP and RXN is closer to the source voltage than to the ground voltage. An enable signal EN_H having a high level may be provided when the common mode voltage of the reception signals RXP and RXN is closer to the source voltage than to the ground voltage. The enable signal EN_H having a low level may be provided when the common mode voltage of the reception signals RXP and RXN is closer to the ground voltage than to the source voltage.

Switches S1 and S2 may connect input terminals of the signal amplifier 100 (for receiving the input signals IN_L and INB_L) to input terminals of the reception signals RXP and RXN, respectively, when the enable signal EN_L is at the high level. Switches S3 and S4 may connect input terminals of the signal amplifier 100 (for receiving the input signals IN_H and INB_H) to input terminals of the reception signals RXP and RXN, respectively, when the enable signal EN_H is at the high level.

Thus, when the common mode voltage of the reception signals RXP and RXN is closer to the ground voltage than to the source voltage, the switching portion 200 may output the reception signals RXP and RXN to be the input signals IN_L and INB_L. When the common mode voltage of the reception signals RXP and RXN is closer to the source voltage than to the ground voltage, the switching portion 200 may output the reception signals RXP and RXN to be the input signals IN_H and INB_H.

The switches S1 and S2 may connect the input terminals of the signal amplifier 100 (for receiving the input signals IN_L and INB_L) to terminals of a source voltage Vdd when the enable signal EN_L is at the low level. The switches S3 and S4 may connect input terminals of the signal amplifier 100 (for receiving the input signals IN_H and INB_H) to a reference voltage (e.g., ground) when the enable signal EN_H is at the low level.

Thus, when the common mode voltage of the reception signals RXP and RXN is closer to the ground voltage than to the source voltage, the switching portion 200 may output the input signals IN_H and INB_H to be a ground voltage level. When the common mode voltage of the reception signals RXP and RXN is closer to the source voltage than to the ground voltage, the switching portion 200 may output the input signals IN_L and INB_L to be a source voltage level.

The common mode voltage of the reception signals RXP and RXN (or the voltage range of the reception signals RXP and RXN) may be different according to a device outputting the reception signals RXP and RXN. For example, when the device is a memory, the common mode voltage of a signal output by the memory may be different according to a type of the memory. The memory may be a dynamic random access memory (DRAM) or another type of memory. According to an example embodiment, the signal receiving circuit may receive a signal output by the memory regardless of the type of the memory.

The output portion 600 may receive the amplified output signals OUT and OUTB and output a received output signal RXOUT determined according to the amplified output signals OUT and OUTB.

The comparator 400 may receive the amplified output signals OUT and OUTB and may output a comparison signal COUT by comparing the amplified output signals OUT and OUTB. The comparator 400 may be an input device (e.g., an input transistor) having characteristics that correspond to the range of the amplified out signals OUT and OUTB or the common mode voltage of the amplified out signals OUT and OUTB. For example, when the amplification portion 300 outputs the amplified output signals OUT and OUTB and the common mode voltage is closer to the ground voltage than to the source voltage, the input device of the comparator 400 may be a p-type metal oxide semiconductor (PMOS) transistor or a transistor having characteristics similar thereto. When the amplification portion 300 outputs the amplified output signals OUT and OUTB and the common mode voltage is closer to the source voltage than to the ground voltage, the input device of the comparator 400 may be an n-type metal oxide semiconductor (NMOS) transistor or a transistor having characteristics similar thereto.

The driver 500 may receive a comparative signal COUT and output a received output signal RXOUT. The driver 500 may include, for example, at least one inverter or buffer.

According to an example embodiment, the amplification portion 300 may set the common mode voltage of the amplified output signals OUT and OUTB as a specific value regardless of the common mode voltage of the reception signals RXP and RXN. Thus, the comparator 400 may include only one of a comparator using a PMOS transistor or a transistor having characteristics similar thereto as an input device and a comparator using an NMOS transistor or a transistor having characteristics similar thereto as an input device. Accordingly, a circuit of the driver 500 may be further simplified, and the size of the signal receiving circuit 10 may be further reduced.

Figure 2:
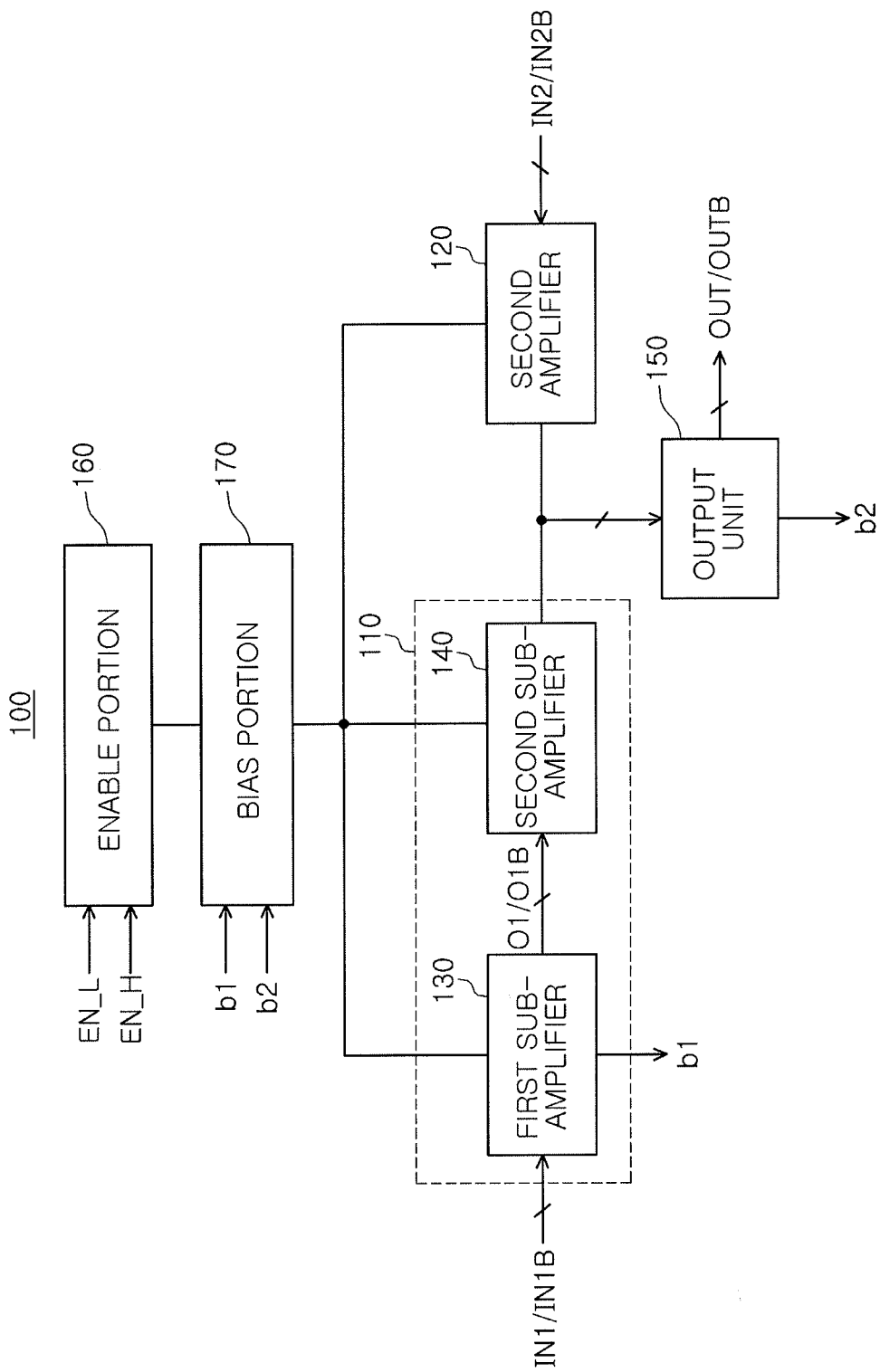
FIG. 2 illustrates an embodiment of a signal amplifier.

FIG. 2 illustrates an embodiment of a signal amplifier 100, which, for example, may be in the signal receiving circuit of FIG. 1. The signal amplifier 100 may include a first amplifier 110, a second amplifier 120, and an output unit 150. The first amplifier 110 may include a first sub-amplifier 130 and a second sub-amplifier 140. In addition, the signal amplifier 100 may include an enable portion 160 and/or a bias portion 170.

The first amplifier 110 may receive the input signals IN1 and IN1B to be amplified and may change the common mode voltage of the input signals IN1 and IN1B to be output. In addition, the first amplifier 110 may output a first bias voltage b1. A second amplifier 120 may receive input signals IN2 and IN2B to be amplified and output. Each of output signals of the first amplifier 110 and each of the output signals of the second amplifier 120 may be output through a common node.

The first sub-amplifier 130 may receive the input signals IN1 and IN1B to be amplified, thereby outputting intermediate amplified output signals O1 and O1B. In addition, the first sub-amplifier 130 may output the first bias voltage b1. The first bias voltage b1 may be provided as a common mode voltage of the intermediate amplified output signals O1 and O1B. The second sub-amplifier 140 may receive the intermediate amplified output signals O1 and O1B to be amplified and may change the common mode voltage of the intermediate amplified output signals O1 and O1B to be output.

The output unit 150 outputs the output signals of the first amplifier 110, that is, one of output signals of the second sub-amplifier 140 and the output signals of the second amplifier 120 to be the amplified output signals OUT and OUTB. In addition, the output unit 150 may output a second bias voltage b2. The second bias voltage b2 may be provided as the common mode voltage of the amplified output signals OUT and OUTB.

The common mode voltage of the input signals IN1 and IN1B may be different from a common mode voltage of the input signals IN2 and IN2B. For example, the common mode voltage of the input signals IN1 and IN may have a value closer to the source voltage than to the ground voltage. The common mode voltage of the input signals IN2 and IN2B may have a value closer to the ground voltage than to the source voltage. In this case, the input signals IN1 and IN1B may be the same signals as input signals IN_H and INB_H of FIG. 1. The input signals IN2 and IN2B may be the same signals as input signals IN_L, INB_L of FIG. 1. In this case, the common mode voltage of the amplified output signals OUT and OUTB may have a value closer to the ground voltage than to the source voltage.

In accordance with one embodiment, the common mode voltage of the input signals IN1 and IN2B may have a value closer to the ground voltage than to the source voltage. The common mode voltage of the input signals IN2 and IN2B may have a value closer to the source voltage than to the ground voltage. In this case, the input signals IN1 and IN1B may be the same signals as the input signals IN_L and INB_L of FIG. 1. The input signals IN2 and IN2B may be the same as the input signals IN_H and INB_H of FIG. 1. In this case, the common mode voltage of the amplified output signals OUT and OUTB may have a value closer to the source voltage than to the ground voltage.

The enable portion 160 (e.g., enable controller) may control supply power to the first amplifier 110 and to the second amplifier 120 based on enable signals EN_L and EN_H. As described above, unnecessary power consumption may be prevented by further including the enable portion 160.

The bias portion 170 (e.g., bias controller) may adjust the level of power (e.g., magnitude of electric current) supplied to the first amplifier 110 and the second amplifier 120 based on the first bias voltage b1 and the second bias voltage b2. As described above, negative feedback control is performed through the bias portion 170 in order to stabilize the amplified output signals OUT and OUTB and/or the intermediate amplified output signals O1 and O1B. For example, the common mode voltage of each of the amplified output signals OUT and OUTB and/or the intermediate amplified output signals O1 and O1B may be converged to have a stable value.

Figure 3:
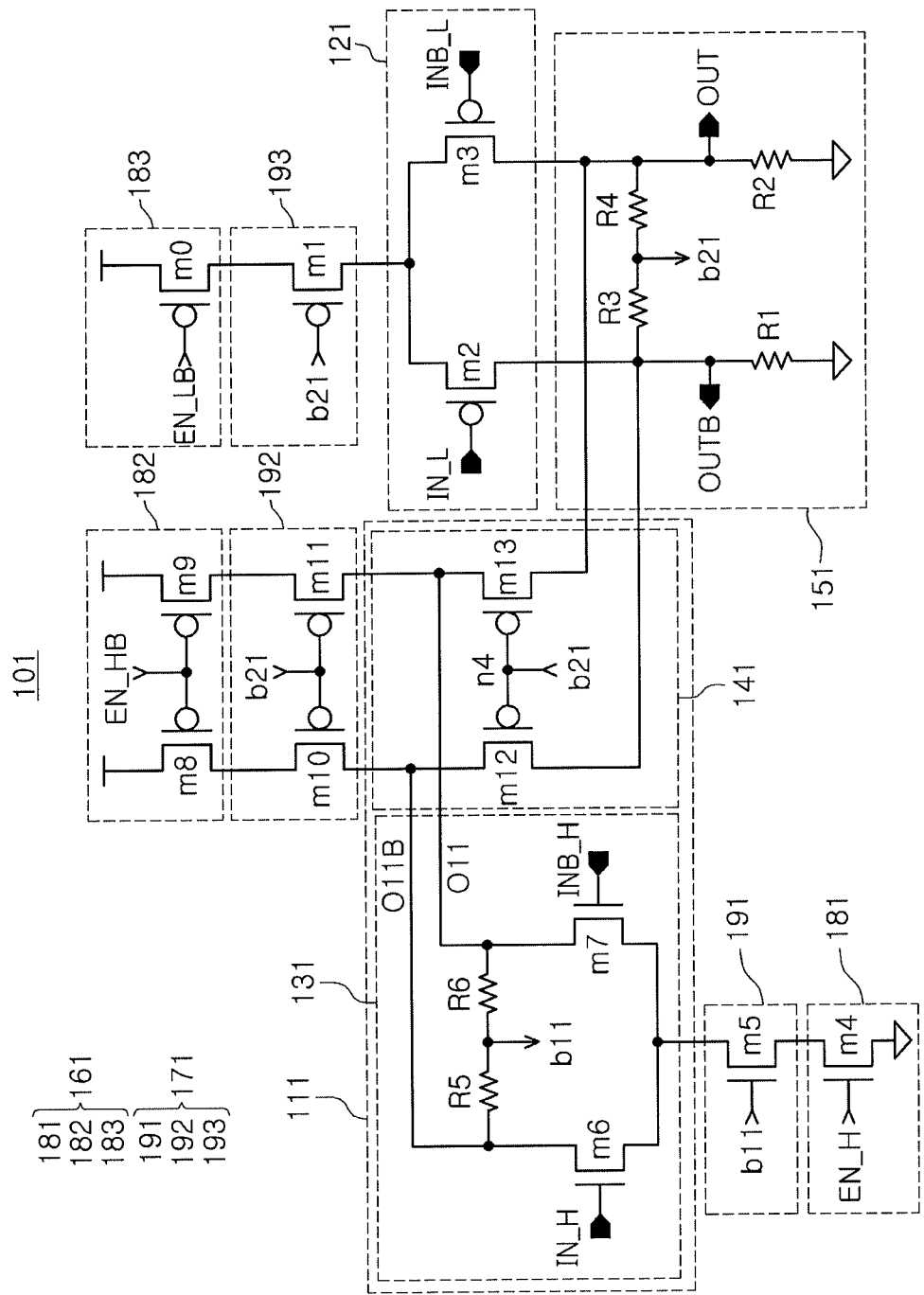
FIG. 3 illustrates a circuit embodiment of the signal amplifier.

FIG. 3 illustrates a circuit embodiment of the signal amplifier 101 of the signal receiving circuit. The signal amplifier 101 may include a first amplifier 111, a second amplifier 121, and an output unit 151. The first amplifier 111 may include a first sub-amplifier 131 and a second sub-amplifier 141. In addition, the signal amplifier 101 may include an enable portion 161 and/or a bias portion 171. The enable portion 161 may include a first enable portion 181, a second enable portion 182, and a third enable portion 183. The bias portion 171 may include a first bias portion 191, a second bias portion 192, and a third bias portion 193.

The first sub-amplifier 131 of the first amplifier 111 may include a transistor m6 including a gate to which an input signal IN_H is applied, a transistor m7 including a gate to which an input signal INB_H is applied, and resistors R5 and R6 connected between a drain of the transistor m6 and a drain of the transistor m7. A source of the transistor m6 is connected to a source of the transistor m7. A first bias voltage b11 may be output from a node between a resistor R5 and a resistor R6. The transistor m6 and the transistor m7 may be an NMOS transistor, e.g., the first sub-amplifier 131 may be an NMOS common source amplifier.

The second sub-amplifier 141 of the first amplifier 111 may include a transistor m12 and a transistor m13. The transistor m12 includes a gate to receive a second bias voltage b21, a source connected to a drain of the transistor m6, and a drain connected to a terminal outputting an amplified output signal OUTB. The transistor m13 includes a gate to receive the second bias voltage b21, a source connected to a drain of the transistor m7, and a drain connected to a terminal outputting an amplified output signal OUT. The transistor m12 and the transistor m13 may be a PMOS transistor, e.g., the second sub-amplifier 141 may be a PMOS common gate amplifier.

In the first amplifier 111, the first sub-amplifier 131 may be connected to the second sub-amplifier 141 in series. For example, the first amplifier 111 may be an NMOS input folded-cascode differential amplifier in which an NMOS common source amplifier is connected to a PMOS common gate amplifier.

The second amplifier 121 may include a transistor m2 and a transistor m3. The transistor m2 includes a gate to receive the input signal IN_L and a drain connected to a terminal outputting the amplified output signal OUTB. The transistor m3 includes a gate to receive the input signal INB_L and a drain connected to a terminal outputting the amplified output signal OUT. A source of the transistor m2 may be connected to a source of the transistor m3. The transistor m2 and the transistor m3 may be PMOS transistors, e.g., the second amplifier 121 may be a PMOS common source amplifier.

The output unit 151 may include resistors R3 and R4 connected between a terminal outputting the amplified output signal OUTB and a terminal outputting the amplified output signal OUT, a resistor R1 connected between the terminal outputting the amplified output signal OUT and a ground, and a resistor R2 connected between the terminal outputting the amplified output signal OUT and the ground. The second bias voltage b21 may be output from a node between the resistor R3 and the resistor R4. As illustrated, the output unit 151 may include resistors and/or other passive devices. Thus, the output unit 151 may output a bias voltage and may be implemented with a faster operating speed.

The first enable portion 181 of the enable portion 161 may include a transistor m4 having a gate to receive an enable signal EN_H and a source connected to a reference potential, e.g., ground. The transistor m4 may be an NMOS transistor. The first enable portion 181 may adjust power flowing through the first amplifier 111 based on the enable signal EN_H. For example, when a high level enable signal EN_H is applied, the transistor m4 may be turned on, thereby allowing power to be supplied to the first sub-amplifier 131 of the first amplifier 111. When a low level enable signal EN_H is applied, the transistor m4 may be turned off to cut off power to the first sub-amplifier 131 of the first amplifier 111.

The second enable portion 182 of the enable portion 161 may include a transistor m8 and a transistor m9. The transistor m8 includes a gate to receive an enable signal EN_HB and a source connected to a terminal of the source voltage. The transistor m9 includes a gate to receive the enable signal EN_HB and a source connected to a terminal of the source voltage. The transistor m8 and the transistor m9 may be PMOS transistors. The enable signal EN_HB may be provided as an inverted enable signal EN_H. The second enable portion 182 may adjust power flowing through the first amplifier 111 based on the enable signal EN_HB. When a low level enable signal EN_HB is applied, the transistor m8 and the transistor m9 may be turned on to allow power to be supplied to the second sub-amplifier 141 of the first amplifier 111. When a high level enable signal EN_HB is applied, the transistor m8 and the transistor m9 may be turned off to cut off power to the second sub-amplifier 141 of the first amplifier 111.

The third enable portion 183 of the enable portion 161 may include a transistor m0 having a gate to receive an enable signal EN_LB and a source connected to a terminal of the source voltage. The transistor m0 may be a PMOS transistor. The enable signal EN_LB may be provided as an inverted enable signal EN_L. The third enable portion 183 may adjust power flowing through the second amplifier 121 based on the enable signal EN_LB. For example, when a low level enable signal EN_LB is applied, the transistor m0 may be turned on to allow power to be supplied to the second amplifier 121. When a high level enable signal EN_LB is applied, the transistor m0 may be turned off to cut off power supplied to the second amplifier 121.

The first bias portion 191 of the bias portion 171 may include a transistor m5 having a gate to receive the first bias voltage b11, a source connected to a drain of the transistor m4, and a drain connected to a node in which the source of the transistor m6 is connected to the source of the transistor m7. The transistor m5 may be an NMOS transistor. The first bias portion 191 may adjust a level of power flowing through the first amplifier 111 based on the bias voltage b11. The first bias portion 191 may adjust the magnitude of the electric current flowing into the first sub-amplifier 131 to correspond to the first bias voltage b11.

The second bias portion 192 of the bias portion 171 may include a transistor m10 and a transistor m11. The transistor m10 includes a gate to receive the second bias voltage b21, a source connected to a drain of the transistor m8, and a drain connected to a source of the transistor m12. The transistor m11 includes a gate to receive the second bias voltage b21, a source connected to a drain of the transistor m9, and a drain connected to a source of the transistor m13. Transistors m10 and m11 may be PMOS transistors. The second bias portion 192 may adjust the level of power flowing through the first amplifier 111 based on the second bias voltage b21. For example, the second bias portion 192 may adjust the magnitude of the electric current flowing through the second sub-amplifier 141 of the first amplifier 111 to correspond to the second bias voltage b21.

The third bias portion 193 of the bias portion 171 may include a transistor m1 having a gate to receive the second bias voltage b21, a source connected to a drain of the transistor m0, and a drain connected to a node in which a source of the transistor m2 is connected to a source of the transistor m3. The transistor m1 may be a PMOS transistor. The third bias portion 193 may adjust the level of power flowing through the second amplifier 121 based on the second bias voltage b21. For example, the third bias portion 193 may adjust the magnitude of the electric current flowing through the second amplifier 121 to correspond to the second bias voltage b21.

A portion or an entirety of the first enable portion 181, the second enable portion 182, the third enable portion 183, the first bias portion 191, the second bias portion 192, and the third bias portion 193 may be excluded according to selection.

Figure 4:
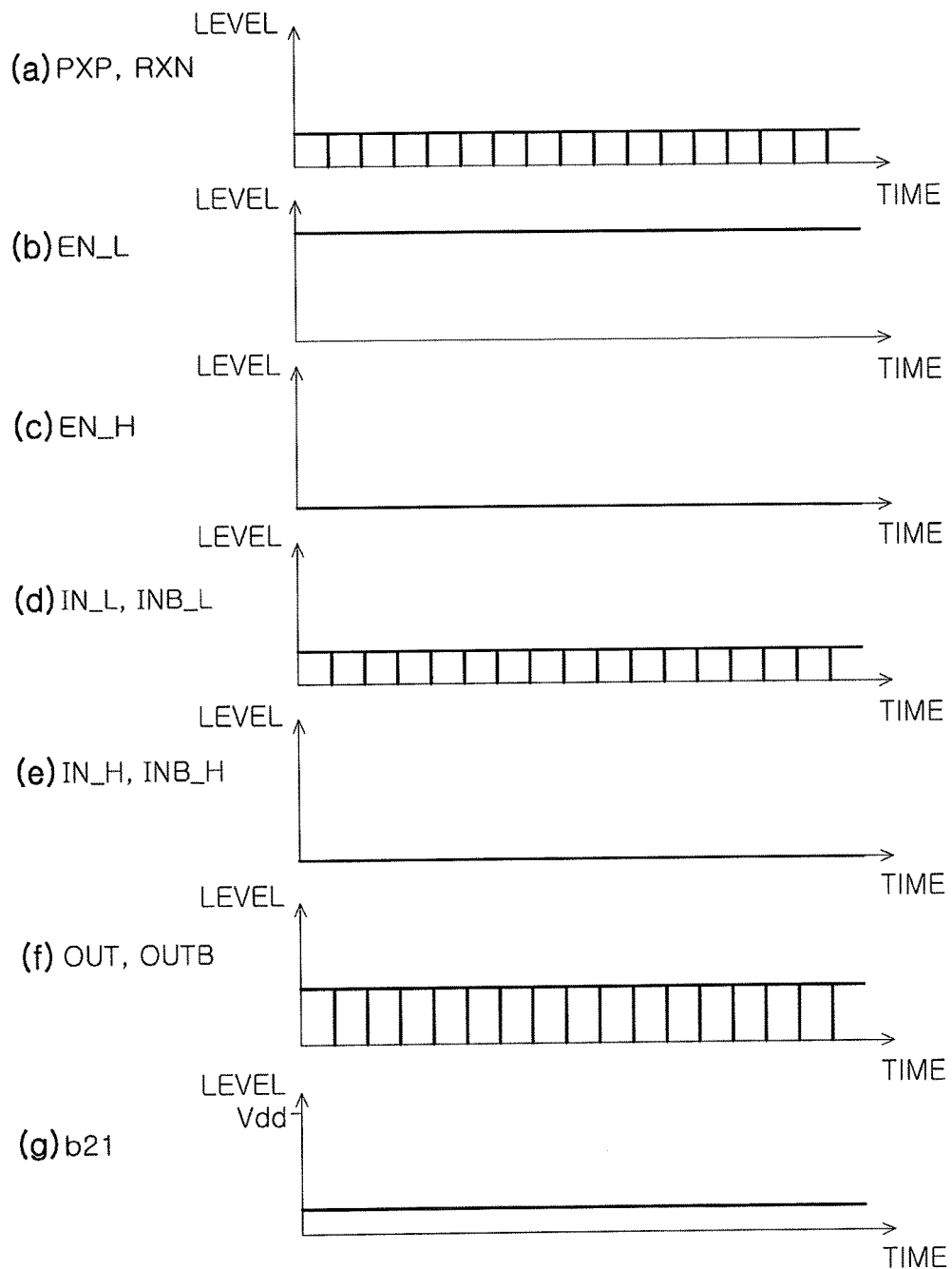
FIGS. 4 and 5 illustrate example operations of the signal amplifier.
Figure 5:
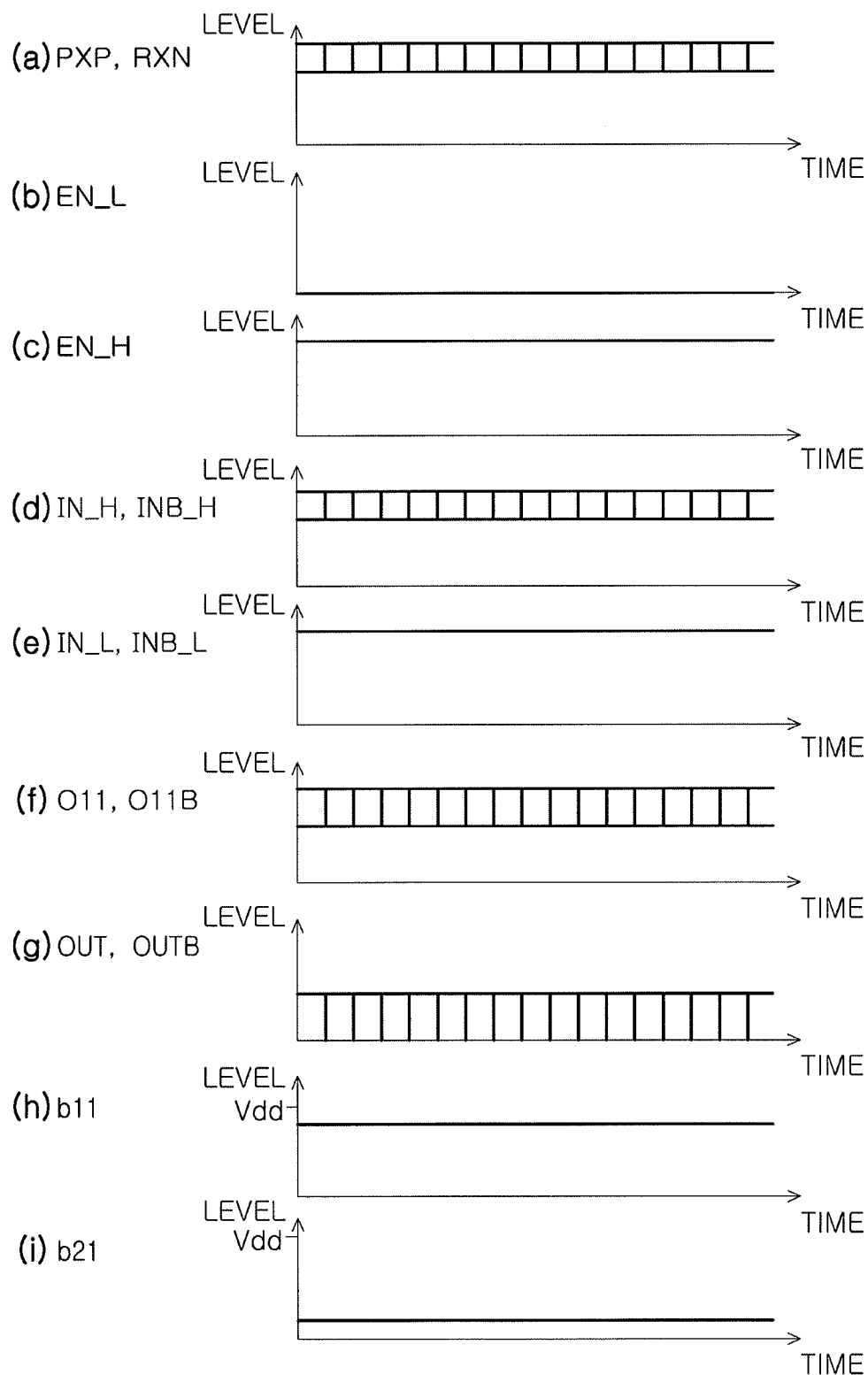

FIGS. 4 and 5 illustrate examples of signals for controlling operations of the signal amplifier of the signal receiving circuit of FIG. 3.

With reference to FIGS. 1 to 4, an operation of a signal amplifier 101 will be described for a case where a common mode voltage of reception signals RXP and RXN is closer to a ground voltage than to a source voltage.

As illustrated in (a) of FIG. 4, when the common mode voltage of the reception signals RXP and RXN is closer to the ground voltage than to the source voltage, a high level enable signal EN_L and a low level enable signal EN_H may be input to the signal amplifier 101, as illustrated in (b) and (c) of FIG. 4. Thus, an enable signal EN_LB having a low level may be provided, while an enable signal EN_HB having a high level may be provided.

When the enable signal EN_H has a low level and the enable signal EN_HB has a high level, all of transistors m4, m8, and m9 of the first enable portion 181 and the second enable portion 182 may be turned off to deactivate the first amplifier 111. Thus, electric current may not substantially flow through transistors in the first amplifier 111. In this case, the magnitude of a first bias voltage b11 may not be determined. As a result, a transistor m5 of the first bias portion 191 may be in a floating state.

When the enable signal EN_LB has a low level, a transistor of a third enable portion 183 may be turned on and the second amplifier 121 may be activated. Thus, bias current may flow into transistors in the second amplifier 121. The magnitude of the bias current may be adjusted by a third bias portion 193.

When the enable signal EN_H has a low level and the enable signal EN_L has a high level, input signals IN_L and INB_L may be the same as reception signals RXP and RXN, as illustrated in (d) of FIG. 4. In addition, as illustrated in (e) of FIG. 4, a value of input signals IN_H and INB_H may be provided as the ground voltage.

As illustrated in (f) of FIG. 4, the second amplifier 121 may amplify the input signals IN_L and INB_L to output amplified output signals OUT and OUTB. The common mode voltage of the amplified output signals OUT and OUTB may have a value closer to the ground voltage than to a source voltage Vdd in a manner similar to the input signals IN_L and INB_L.

In this case, as illustrated in (g) of FIG. 4, the magnitude of the second bias voltage b21 may be provided as the common mode voltage of the amplified output signals OUT and OUTB. The second bias voltage b21 may be applied to the third bias portion 193 to perform negative feedback control.

Subsequently, with reference to FIGS. 1, 3, and 5, the operation of the signal amplifier 101 will be described in a case where the common mode voltage of the reception signals RXP and RXN is closer to the source voltage than to the ground voltage.

As illustrated in (a) of FIG. 5, when the common mode voltage of the reception signals RXP and RXN is closer to the source voltage than to the ground voltage, a low level enable signal EN_L and a high level enable signal EN_H may be input to the signal amplifier 101, as illustrated in (b) and (c) of FIG. 5. Thus, an enable signal EN_LB having a high level may be provided, while an enable signal EN_HB having a low level may be provided.

When the enable signal EN_L has a low level, a transistor m0 of the third enable portion 183 may be turned off to deactivate the second amplifier 121. Thus, electric current may not substantially flow through transistors in the second amplifier 121.

When the enable signal EN_H has a high level and the enable signal EN_HB has a low level, transistors m4, m8, and m9 of the first enable portion 181 and the second enable portion 182 may be turned on to activate the first amplifier 111. Thus, bias current may flow into transistors in the first amplifier 111. The magnitude of the bias current may be adjusted by the first bias portion 191 and a second bias portion 192.

When the enable signal EN_H has a high level and the enable signal EN_L has a low level, the input signals IN_H and INB_H may be the same as reception signals RXP and RXN, as illustrated in (d) of FIG. 5. In addition, as illustrated in (e) of FIG. 5, a value of the input signals IN_L and INB_L may be provided as a source voltage Vdd.

As illustrated in (f) of FIG. 5, a first sub-amplifier 131 of the first amplifier 111 may amplify the input signals IN_H and INB_H to output intermediate amplified output signals O11 and O11B. The common mode voltage of the intermediate amplified output signals O11 and O11B may be provided to have a value closer to the source voltage Vdd than to the ground voltage in a manner similar to the input signals IN_H and INB_H.

As illustrated in (g) of FIG. 5, a second sub-amplifier 141 of the first amplifier 111 may amplify the intermediate amplified output signals O11 and O11B and may change the common mode voltage of the intermediate amplified output signals O11 and O11B to output the amplified output signals OUT and OUTB. Thus, the common mode voltage of the amplified output signals OUT and OUTB may be different from the common mode voltage of the intermediate amplified output signals O11 and O11B in that the common mode voltage of the amplified output signals OUT and OUTB may be have a value closer to the ground voltage than to the source voltage Vdd.

As illustrated in (h) and (i) of FIG. 5, the first bias voltage b11 may be provided as the common mode voltage of the intermediate amplified output signals O11 and O11B. The magnitude of the second bias voltage b21 may be provided as the common mode voltage of the amplified output signals OUT and OUTB. The first bias voltage b11 may be applied to the first bias portion 191. The second bias voltage b21 may be applied to the second bias portion 192 and a gate of transistors m12 and m13 of the second sub-amplifier 141 of the first amplifier 111. Thus, negative feedback control may be performed.

Thus, according to an example embodiment illustrated in FIGS. 1 to 3, the signal amplifier 101 may amplify a change in the reception signals RXP and RXN to output the amplified output signals OUT and OUTB. In this case, the common mode voltage of the amplified output signals OUT and OUTB may have a value closer to the ground voltage than to the source voltage, regardless of the common mode voltage of the reception signals RXP and RXN.

Figure 6:
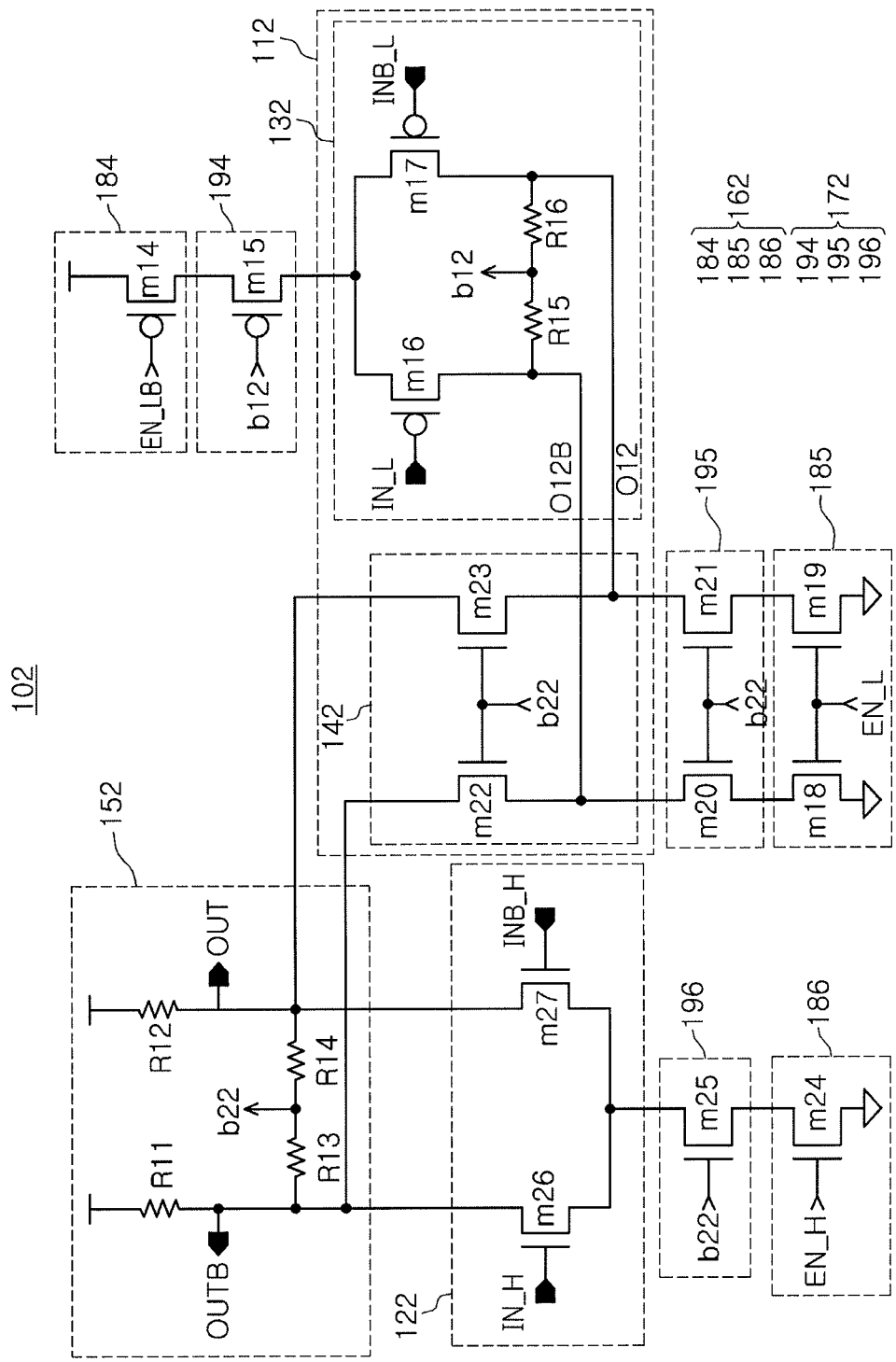
FIG. 6 illustrates another circuit embodiment of a signal amplifier.

FIG. 6 illustrates another circuit embodiment of the signal amplifier 102 of the signal receiving circuit. A signal amplifier 102 may include a first amplifier 112, a second amplifier 122, and an output unit 152. The first amplifier 112 may include a first sub-amplifier 132 and a second sub-amplifier 142. In addition, the signal amplifier 102 may include an enable portion 162 and/or a bias portion 172. The enable portion 162 may include a first enable portion 184, a second enable portion 185, and a third enable portion 186. The bias portion 172 may include a first bias portion 194, a second bias portion 195, and a third bias portion 196.

The first sub-amplifier 132 of the first amplifier 112 may include a transistor m16, a transistor m17, and resistors R15 and R16. The transistor m16 includes a gate to receive an input signal IN_L. The transistor m17 includes a gate to receive an input signal INB_L. The resistors R15 and R16 are connected between a drain of the transistor m16 and a drain of the transistor m17. A source of the transistor m16 may be connected to a source of the transistor m17. A first bias voltage b12 may be output from a node between a resistor R15 and a resistor R16. The transistor m16 and the transistor m17 may be PMOS transistors, e.g., the first sub-amplifier 131 may be a PMOS common source amplifier.

The second sub-amplifier 142 of the first amplifier 112 may include a transistor m22 and a transistor M23. The transistor m22 includes a gate to receive a second bias voltage b22, a source connected to a drain of the transistor m16, and a drain connected to a terminal outputting an amplified output signal OUTB. The transistor m23 includes a gate to receive the second bias voltage b22, a source connected to a drain of the transistor m17, and a drain connected to a terminal outputting an amplified output signal OUT. The transistor m22 and the transistor m23 may be NMOS transistors, e.g., the second sub-amplifier 142 may be an NMOS common gate amplifier.

In the first amplifier 112, the first sub-amplifier 132 may be connected to the second sub-amplifier 142 in series. For example, the first amplifier 112 may be a PMOS input folded-cascode differential amplifier in which the PMOS common source amplifier is connected to the NMOS common gate amplifier.

The second amplifier 122 may include a transistor m26 and a transistor m27. The transistor m26 includes a gate to receive an input signal IN_H and a drain connected to a terminal outputting the amplified output signal OUTB. The transistor m27 includes a gate to receive an input signal INB_H and a drain connected to a terminal outputting the amplified output signal OUT. A source of the transistor m26 may be connected to a source of the transistor m27. The transistor m26 and the transistor m27 may be NMOS transistors, e.g., the second amplifier 122 may be an NMOS common source amplifier.

The output unit 152 may include resistors R11, R12, R13 and R14. The resistors R13 and R14 are connected between a terminal outputting the output signal OUTB and a terminal outputting the output signal OUT. The resistor R1 is connected between the terminal of the output signal OUTB and a source voltage. The resistor R12 is connected between the terminal of the output signal OUT and the source voltage. The second bias voltage b22 may be output from a node between the resistor R13 and the resistor R14. As illustrated, the output unit 152 may include resistors and/or other passive devices. Thus, the output unit 151 may output a bias voltage and may be implemented with a faster operating speed.

The first enable portion 184 of the enable portion 162 may include a transistor m14 having a gate to receive an enable signal EN_LB and a source connected to the source voltage. The transistor m14 may be a PMOS transistor. In one embodiment, the enable signal EN_LB may be provided as an inverted enable signal EN_L. The first enable portion 184 may adjust power flowing through the first amplifier 112 based on the enable signal EN_LB. For example, when a low level enable signal EN_LB is applied, the transistor m14 may be turned on to allow power to be supplied to the first sub-amplifier 132 of the first amplifier 112. When a high level enable signal EN_LB is applied, the transistor m14 may be turned off to cut off power to the first sub-amplifier 132 of the first amplifier 112.

The second enable portion 185 of the enable portion 162 may include a transistor m18 and a transistor m19. The transistor m18 includes a gate to receive an enable signal EN_L and a source connected to a ground. The transistor m19 includes a gate to receive the enable signal EN_L and a source connected to ground. The second enable portion 185 may adjust power flowing through the first amplifier 112 based on the enable signal EN_L. For example, when a high level enable signal EN_L is applied, the transistors m18 and m19 may be turned on to allow power to be supplied to the second sub-amplifier 142 of the first amplifier 112. When a low level enable signal EN_L is applied, the transistors m18 and m19 may be turned off to cut off power to the second sub-amplifier 142 of the first amplifier 112.

The third enable portion 186 of the enable portion 161 may include a transistor m24 having a gate to receive an enable signal EN_H and a source connected to ground. The transistor m24 may be an NMOS transistor. The third enable portion 186 may adjust power flowing through the second amplifier 12 based on the enable signal EN_H. For example, when a high level enable signal EN_H is applied, the transistor m24 may be turned on to allow power to be supplied to the second amplifier 122. When a low level enable signal EN_H is applied, the transistor m24 may be turned off to cut off power to the second amplifier 122.

The first bias portion 194 of the bias portion 172 may include a transistor m15 having a gate to receive the first bias voltage b12, a source connected to a drain of the transistor m14, and a drain connected to a node that connects a source of the transistor m16 to a source of the transistor m17. The transistor m15 may be a PMOS transistor. The first bias portion 194 may adjust the level of power flowing through the first amplifier 112 based on the first bias voltage b12. For example, the first bias portion 194 may adjust the magnitude of electric current flowing into the first sub-amplifier 132 to correspond to the first bias voltage b12.

The second bias portion 195 of the bias portion 172 may include a transistor m20 and a transistor m21. The transistor m20 includes a gate to receive a second bias voltage b22, a source connected to a drain of the transistor m18, and a drain connected to a source of the transistor m22. The transistor m21 includes a gate to receive the second bias voltage b22, a source connected to a drain of the transistor m19, and a drain connected to a source of the transistor m23. Transistors m20 and m21 may be NMOS transistors. The second bias portion 195 may adjust the level of power flowing through the first amplifier 112 based on the second bias voltage b22. For example, the second bias portion 195 may adjust the magnitude of electric current flowing through the second sub-amplifier 142 of the first amplifier 112 to correspond to the second bias voltage b22.

The third bias portion 196 of the bias portion 172 may include a transistor m25 having a gate to receive the second bias voltage b22, a source connected to a drain of the transistor m24, and a drain connected to a node in which a source of the transistor m26 is connected to a source of the transistor m27. The transistor m25 may be an NMOS transistor. The third bias portion 196 may adjust the level of power flowing through the second amplifier 122 based on the second bias voltage b22. For example, the third bias portion 196 may adjust the magnitude of the electric current flowing through the second amplifier 122 to correspond to the second bias voltage b22.

A portion or all of the first enable portion 184, the second enable portion 185, the third enable portion 186, the first bias portion 194, the second bias portion 195, and the third bias portion 196 may be excluded according to selection.

Figure 7:
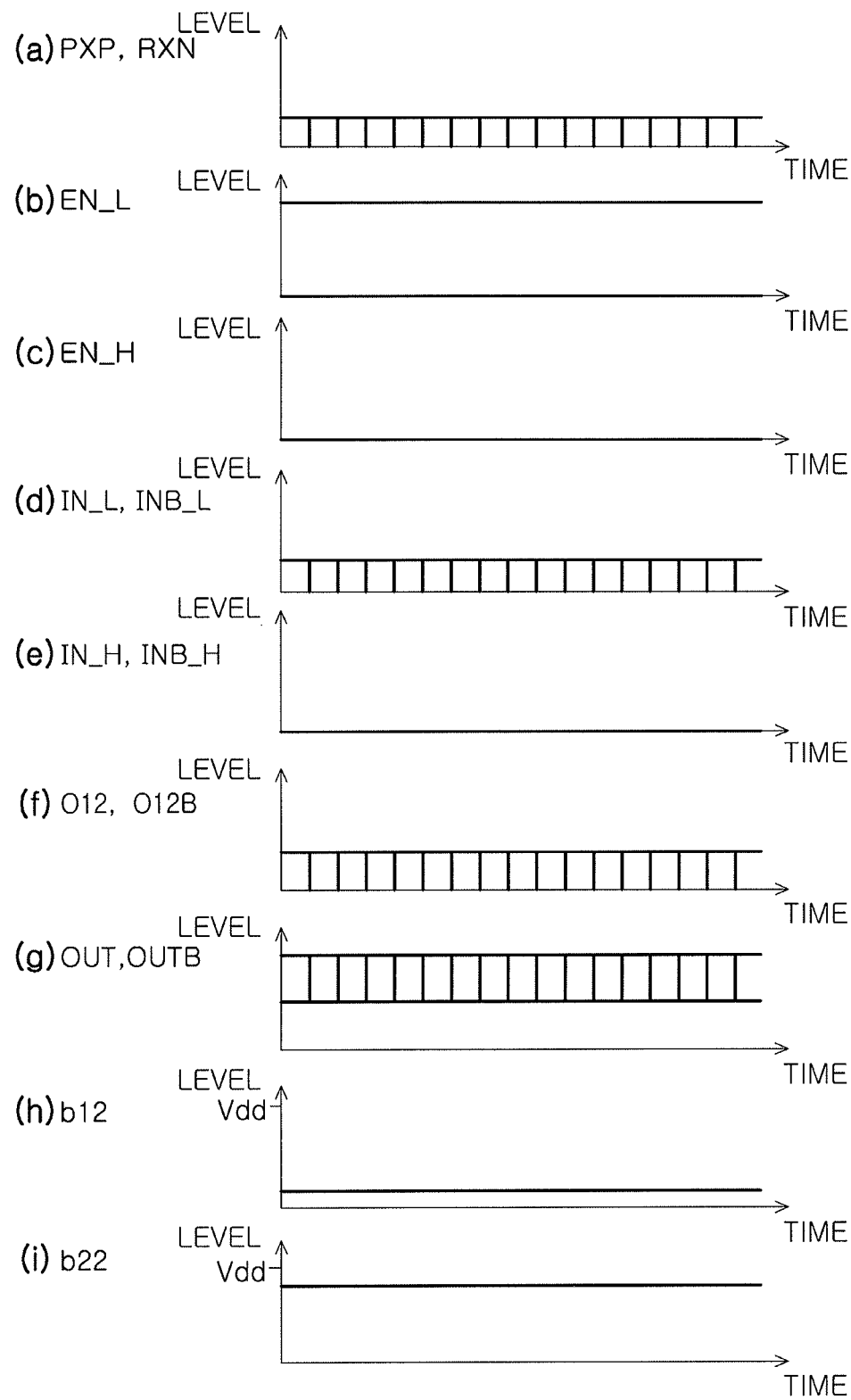
FIGS. 7 and 8 illustrate example operations of the signal amplifier of FIG. 6.
Figure 8:
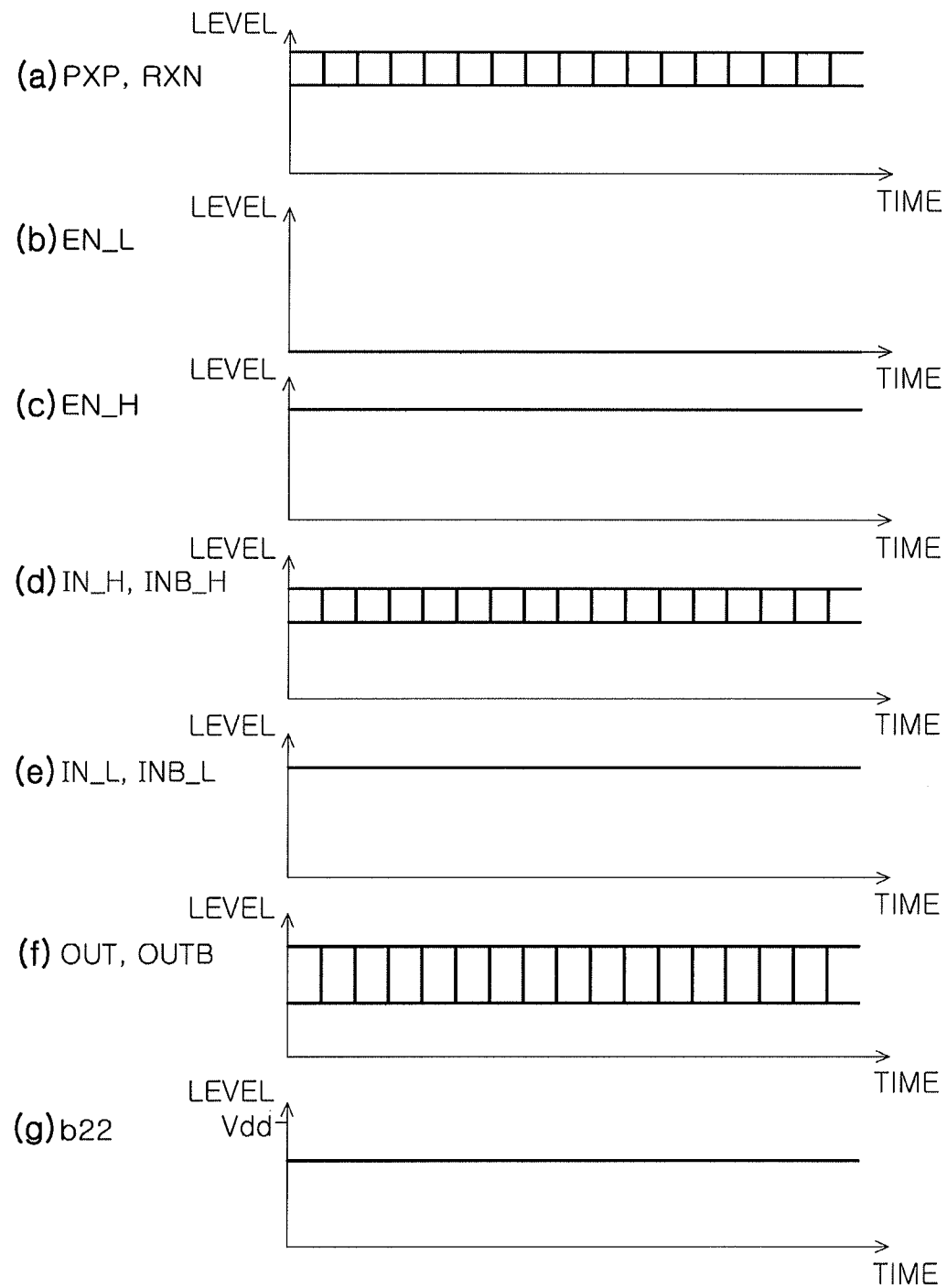

FIGS. 7 and 8 illustrate signals for performing example operations of the signal amplifier 102 of the signal receiving circuit of FIG. 6.

First, with reference to FIGS. 1, 2, 6, and 7, an operation of a signal amplifier 102 will be described in a case where a common mode voltage of reception signals RXP and RXN is closer to a ground voltage than to a source voltage.

As illustrated in (a) of FIG. 7, when the common mode voltage of the reception signals RXP and RXN is closer to the ground voltage than to the source voltage, a high level enable signal EN_L and a low level enable signal EN_H may be input to the signal amplifier 102, as illustrated in (b) and (c) of FIG. 7. Thus, an enable signal EN_LB having a low level may be provided, while an enable signal EN_HB having a high level may be provided.

When the enable signal EN_H has a low level, a transistor m24 of the third enable portion 186 may be turned off to deactivate a second amplifier 122. Thus, electric current may not substantially flow through transistors in the second amplifier 122.

When the enable signal EN_HB has a low level and the enable signal EN_L has a high level, transistors m15, m18, and m19 of a first enable portion 184 and a second enable portion 185 may be turned on to activate the first amplifier 112. Thus, bias current may flow into transistors in the first amplifier 112. The magnitude of the bias current may be adjusted by a first bias portion 194 and a second bias portion 195.

In addition, when the enable signal EN_H has a low level and the enable signal EN_L has a high level, input signals IN_L and INB_L may be the same as reception signals RXP and RXN, as illustrated in (d) of FIG. 7. In addition, as illustrated in (e) of FIG. 7, a value of input signals IN_H and INB_H may be provided as a ground voltage.

As illustrated in (f) of FIG. 7, a first sub-amplifier 132 of a first amplifier 112 may amplify the input signals IN_L and INB_L to output intermediate amplified output signals O12 and O12B. The common mode voltage of the intermediate amplified output signals O12 and O12B may have a value closer to the ground voltage than to a source voltage Vdd in a manner similar to the input signals IN_L and INB_L.

As illustrated in (g) of FIG. 7, a second sub-amplifier 142 of the first amplifier 112 may amplify the intermediate amplified output signals O12 and O12B and change the common mode voltage of the intermediate amplified output signals O12 and O12B to output the amplified output signals OUT and OUTB. Thus, the common mode voltage of the amplified output signals OUT and OUTB may be different from the common mode voltage of the intermediate amplified output signals O11 and O11B, in that the common mode voltage of the amplified output signals OUT and OUTB may have a value closer to the source voltage Vdd than to the ground voltage.

As illustrated in (h) and (i) of FIG. 7, a first bias voltage b12 may be provided as the common mode voltage of the intermediate amplified output signals O12 and O12B. The magnitude of a second bias voltage b22 may be provided as the common mode voltage of the amplified output signals OUT and OUTB. The first bias voltage b12 may be applied to the first bias portion 194. The second bias voltage b22 may be applied to the second bias portion 195 and a gate of transistors m22 and m23 of the second sub-amplifier 142 of the first amplifier 112, to perform negative feedback control.

Subsequently, with reference to FIGS. 1, 2, 6, and 8, the operation of the signal amplifier 102 is described in a case where the common mode voltage of the reception signals RXP and RXN is closer to the source voltage than to the ground voltage.

As illustrated in (a) of FIG. 8, in a case where the common mode voltage of the reception signals RXP and RXN is closer to the source voltage than to the ground voltage, a low level enable signal EN_L and a high level enable signal EN_H may be input to the signal amplifier 102, as illustrated in (b) and (c) of FIG. 8. Thus, the enable signal EN_LB having a high level may be provided, while the enable signal EN_HB having a low level may be provided.

When the enable signal EN_L has a low level and the enable signal EN_LB has a high level, all of transistors m14, m18, and m19 of the first enable portion 184 and the second enable portion 185 may be turned off to deactivate the first amplifier 112. Thus, electric current may not substantially flow through transistors in the first amplifier 112. In this case, the magnitude of the first bias voltage b12 may not be determined. As a result, the transistor m15 of the first bias portion 194 may be in a floating state.

When the enable signal EN_H has a high level, the transistor m24 of the third enable portion 186 may be turned on to activate the second amplifier 122. Thus, bias current may flow into transistors in the second amplifier 121. The magnitude of the bias current may be adjusted by a third bias portion 196.

When the enable signal EN_H has a high level and the enable signal EN_L has a low level, the input signals IN_H and INB_H may be the same as the reception signals RXP and RXN, as illustrated in (d) of FIG. 8. In addition, as illustrated in (e) of FIG. 8, a value of input signals IN_L and INB_L may be provided as the source voltage Vdd.

As illustrated in (f) of FIG. 8, the second amplifier 122 may amplify the input signals IN_H and INB_H to output the amplified output signals OUT and OUTB. The common mode voltage of the amplified output signals OUT and OUTB may have a value closer to the source voltage Vdd than to the ground voltage in a manner similar to the input signals IN_H and INB_H.

In this case, as illustrated in (g) of FIG. 8, the magnitude of the second bias voltage b22 may be provided as the common mode voltage of the amplified output signals OUT and OUTB. The second bias voltage b22 may be applied to the third bias portion 196, thereby performing negative feedback control.

According to an example embodiment illustrated in FIGS. 1, 2, and 6, the signal amplifier 102 may amplify a change in the reception signals RXP and RXN to output the amplified output signals OUT and OUTB. In this case, the common mode voltage of the amplified output signals OUT and OUTB may have a value closer to the source voltage than to the ground voltage, regardless of the common mode voltage of the reception signals RXP and RXN.

Figure 9:
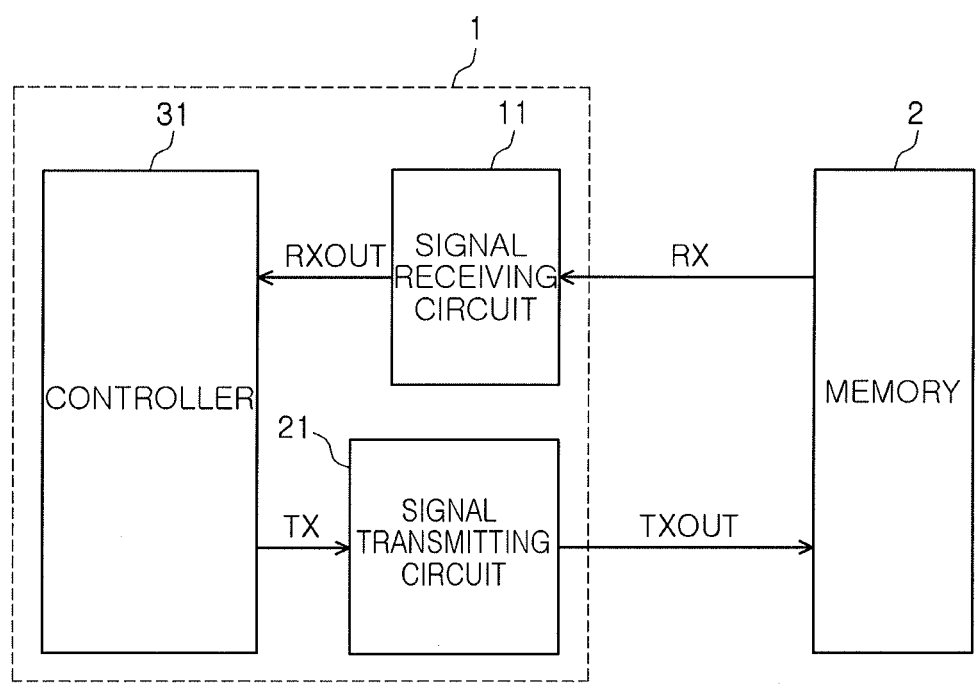
FIG. 9 illustrates an embodiment of a device including a signal receiving circuit.

FIG. 9 illustrates an embodiment of a device which includes a signal receiving circuit according to any of the aforementioned example embodiments. The device may be, for example, an application processor 1 including a signal receiving circuit 11, a signal transmitting circuit 21, and a controller 31. In addition, the device may include the application processor 1 and a memory 2.

A signal receiving circuit described with reference to any of the embodiments of FIGS. 1 to 8 may be used as the signal receiving circuit 11. The signal receiving circuit 11 may amplify a reception signal RX input from another external device, such as the memory 2, to output a received output signal RXOUT.

The signal transmitting circuit 21 may amplify a transmission signal TX input from the controller 31 to output a transmitted output signal TXOUT. The reception signal RX and/or the transmitted output signal TXOUT may be provided as data or further control signals. The controller 31 may receive the received output signal RXOUT and perform a predetermined operation using the received output signal RXOUT, e.g., an arbitrary arithmetic operation, an arbitrary display operation, and/or another operation. In addition, the controller 31 may output data to be stored in the memory 2 and/or a control signal for controlling other devices or memory 2 as the transmission signal TX.

The memory 2 may output stored data, or the like, to be the reception signal RX and may perform an operation of storing data by inputting the transmitted output signal TXOUT.

The device illustrated in FIG. 9 may be a mobile device including an application processor and a memory. For example, when the signal receiving circuit according to an example embodiment is applied to the application processor of the mobile device, power consumption may be reduced and the size of the device may be reduced.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, processors, amplifiers, comparators, drivers, portions, inputs, outputs, and other signal generating and signal processing features of the disclosed embodiments may be implemented in logic which, for example, may include hardware, software, or both. When implemented at least partially in hardware, the controllers, processors, amplifiers, comparators, drivers, portions, inputs, outputs, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, amplifiers, comparators, drivers, portions, inputs, outputs, and other signal generating and signal processing features may include, for example, a memory or other storage device for storing code or instructions to be executed, for example, by a computer, processor, microprocessor, controller. or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned example embodiments, a signal amplifier, a signal receiving circuit including the signal amplifier, or device including the signal receiving circuit may have a wide input signal range. In addition, the size of the signal amplifier, the signal receiving circuit, or a device including the same may be reduced. Furthermore, the amount of power consumed by the signal amplifier, the signal receiving circuit, or the device may also be reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A signal amplifier, comprising:
  a first amplifier to amplify a first input signal to form a first amplified output signal, the first input signal having a common mode voltage in a first voltage range and the first amplified output signal having a common mode voltage in a second voltage range different from the first voltage range;
  a second amplifier to amplify a second input signal to form a second amplified output signal, the second input signal, different from the first input signal, having a common mode voltage in the second voltage range and the second amplified output signal having a common mode voltage in the second voltage range, wherein the first amplifier is off when the second amplifier is on and the second amplifier is off when the first amplifier is on; and
  an output to output the first amplified output signal or the second amplified output signal as an amplified output signal.

2. The signal amplifier as claimed in claim 1, wherein:
  the first amplifier is to output a first bias voltage in the first voltage range,
  the output is to output a second bias voltage in the second voltage range, and
  the signal amplifier includes a bias controller to adjust a level of power supplied to the first amplifier and the second amplifier based on the first bias voltage and the second bias voltage.

3. The signal amplifier as claimed in claim 1, further comprising:
  an enable controller to control supply power to the first amplifier or the second amplifier based on a first enable signal activated when the first input signal is input and a second enable signal activated when the second input signal is input.

4. The signal amplifier as claimed in claim 1, wherein the first amplifier includes:
  a first sub-amplifier to amplify the first input signal to form an intermediate amplified output signal having a common mode voltage in the first voltage range; and
  a second sub-amplifier to amplify the intermediate amplified output signal to form the first amplified output signal.

5. The signal amplifier as claimed in claim 4, further comprising:
  a bias controller to adjust a level of power supplied to the first amplifier and the second amplifier based on a common mode voltage of the intermediate amplified output signal and a common mode voltage of the amplified output signal.

6. The signal amplifier as claimed in claim 4, wherein:
the first voltage range includes values closer to a source voltage than to a ground voltage,
the second voltage range includes values closer to the ground voltage than to the source voltage,
the first sub-amplifier is an n-type metal oxide semiconductor (NMOS) common source amplifier,
the second sub-amplifier is a p-type metal oxide semiconductor (PMOS) common gate amplifier, and
the second amplifier is a PMOS common source amplifier.

7. The signal amplifier as claimed in claim 4, wherein:
the first voltage range includes values closer to a ground voltage than to a source voltage,
the second voltage range includes values closer to the source voltage than to the ground voltage,
the first sub-amplifier is a PMOS common source amplifier,
the second sub-amplifier is an NMOS common gate amplifier, and
the second amplifier is an NMOS common source amplifier.

8. The signal amplifier as claimed in claim 1, wherein the first amplifier includes:
a first-type first transistor including a gate to receive one signal of the first input signal,
a first-type second transistor including a gate to receive another signal of the first input signal and a source connected to a source of the first-type first transistor;
a first resistor and a second resistor connected between a drain of the first-type first transistor and a drain of the first-type second transistor;
a second-type first transistor including a source connected to the drain of the first-type first transistor, a drain connected to a first output terminal to output one signal of the amplified output signal, and a gate to receive a common mode voltage of the amplified output signal; and
a second-type second transistor including a source connected to the drain of the first-type second transistor, a drain connected to a second output terminal to output another signal of the amplified output signal, and a gate connected to the gate of the second-type first transistor.

9. The signal amplifier as claimed in claim 8, wherein the second amplifier includes:
a second-type third transistor including a gate to receive one signal of the second input signal and a drain connected to the first output terminal; and
a second-type fourth transistor including a gate to receive another signal of the second input signal, a drain connected to the second output terminal, and a source connected to the source of the second-type third transistor.

10. The signal amplifier as claimed in claim 9, wherein the output includes a third resistor and a fourth resistor connected between the first output terminal and the second output terminal.

11. The signal amplifier as claimed in claim 10, wherein:
the first amplifier is to output a voltage of a node between the first resistor and the second resistor as a first bias voltage,
the output is to output a voltage of a node between the third resistor and the fourth resistor as a second bias voltage, and
the signal amplifier includes a bias controller to control a magnitude of an electric current input to the first amplifier or the second amplifier or a magnitude of an electric current output from the first amplifier or the second amplifier based on the first bias voltage and the second bias voltage.

12. A signal amplifier, comprising:
a first type folded-cascode amplifying part configured to receive a first input signal pair and output a first amplified output signal pair in response to a first state of an enable signal;
a second type common source amplifying part configured to receive a second input signal pair, different from the first input signal pair, and output a second amplified output signal pair in response to a second state of the enable signal; and
an output part including a load for the first type folded-cascode amplifying part and the second type common source amplifying part, and configured to output one of the first amplified output signal pair and the second amplified output signal pair as an amplified output signal pair.

13. The signal amplifier as claimed in claim 12, wherein:
the first type folded-cascode amplifying part includes:
an n-type metal oxide semiconductor (NMOS) common source amplifier to amplify the first input signal pair to form an intermediate amplified output signal pair; and
a p-type metal oxide semiconductor (PMOS) common gate amplifier to amplify the intermediate amplified output signal pair to form the first amplified output signal pair, and
the second type common source amplifying part is a PMOS common source amplifier.

14. The signal amplifier as claimed in claim 13, wherein:
the NMOS common source amplifier is to output a first bias voltage in a first voltage range,
the output is to output a second bias voltage in a second voltage range different from the first voltage range,
the signal amplifier further comprises
a first bias controller to adjust a level of power supplied to the NMOS common source amplifier based on the first bias voltage;
a second bias controller to adjust a level of power supplied to the PMOS common gate amplifier based on the second bias voltage; and
a third bias controller to adjust a level of power supplied to the PMOS common source amplifier based on the second bias voltage, and
the first voltage range includes values closer to a source voltage than to a ground voltage, and the second voltage range includes values closer to the ground voltage than to the source voltage.

15. The signal amplifier as claimed in claim 12, wherein:
the first type folded-cascode amplifying part includes:
an p-type metal oxide semiconductor (PMOS) common source amplifier to amplify the first input signal pair to form an intermediate amplified output signal pair; and
a n-type metal oxide semiconductor (NMOS) common gate amplifier to amplify the intermediate amplified output signal pair to form the first amplified output signal pair, and
the second type common source amplifying part is a NMOS common source amplifier.

16. The signal amplifier as claimed in claim 15, wherein:
the PMOS common source amplifier is to output a first bias voltage in a first voltage range,
the output is to output a second bias voltage in a second voltage range different from the first voltage range, the signal amplifier further comprises
a first bias controller to adjust a level of power supplied to the PMOS common source amplifier based on the first bias voltage;
a second bias controller to adjust a level of power supplied to the NMOS common gate amplifier based on the second bias voltage; and
a third bias controller to adjust a level of power supplied to the NMOS common source amplifier based on the second bias voltage, and
the first voltage range includes values closer to a ground voltage than to a source voltage, and the second voltage range includes values closer to the source voltage than to the ground voltage.

17. A signal receiving circuit, comprising:
a signal amplifying portion including a first type folded-cascode amplifier configured to receive a first input signal pair and output a first amplified output signal pair in response to a first state of an enable signal, a second type common source amplifier configured to receive a second input signal pair, different from the first input signal pair, and output a second amplified output signal pair in response to a second state of the enable signal, and an output including a load for the first type folded-cascode amplifier and the second type common source amplifier, and configured to output one of the first amplified output signal pair and the second amplified output signal pair as an amplified output signal pair; and
an output portion configured to output an output signal based on the amplified output signal pair, wherein an input terminal of the output portion includes transistors of a same conductivity type.

18. The signal receiving circuit of claim 17, wherein:
the first type folded-cascode amplifier includes:
an n-type metal oxide semiconductor (NMOS) common source amplifier to amplify the first input signal pair to form an intermediate amplified output signal pair; and
a p-type metal oxide semiconductor (PMOS) common gate amplifier to amplify the intermediate amplified output signal pair to form the first amplified output signal pair,
the second amplifier is a PMOS common source amplifier, and
the input terminal of the output portion includes PMOS transistors.

19. The signal receiving circuit of claim 17, wherein:
the first type folded-cascode amplifier includes:
an p-type metal oxide semiconductor (PMOS) common source amplifier to amplify the first input signal pair to form an intermediate amplified output signal pair; and
a n-type metal oxide semiconductor (NMOS) common gate amplifier to amplify the intermediate amplified output signal pair to form the first amplified output signal pair,
the second amplifier is a NMOS common source amplifier, and
the input terminal of the output portion includes MMOS transistors.

20. A signal receiving circuit of claim 17, further comprising:
a switching portion configured to output a reception signal as the first input signal pair in response to first state of the enable signal and to output the reception signal as the second input signal pair in response to second state of the enable signal.

* * * * *